(12) United States Patent
Chu et al.

(10) Patent No.: US 7,372,298 B2
(45) Date of Patent: May 13, 2008

(54) CHIP WITH ADJUSTABLE PINOUT FUNCTION AND METHOD THEREOF

(75) Inventors: Hung-Jen Chu, Taipei (TW); Chao-Hsin Lu, Tao-Yuan Hsien (TW); Shiu-Rong Tong, Kao-Hsiung (TW); Yu-Pin Chou, Miao-Li Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 11/277,361

(22) Filed: Mar. 24, 2006

(65) Prior Publication Data
US 2006/0220687 A1 Oct. 5, 2006

(30) Foreign Application Priority Data
Mar. 29, 2005 (TW) .............................. 94109777 A

(51) Int. Cl.
*H03K 19/173* (2006.01)
*H03K 19/00* (2006.01)

(52) U.S. Cl. ........................... 326/38; 326/47; 326/101

(58) Field of Classification Search ............ 326/37–41, 326/47, 101
See application file for complete search history.

(56) References Cited

U.S. PATENT DOCUMENTS

| | | | |
|---|---|---|---|
| 5,852,712 A * | 12/1998 | Allen et al. .................... 714/5 |
| 6,057,705 A * | 5/2000 | Wojewoda et al. ........... 326/38 |
| 6,192,431 B1 * | 2/2001 | Dabral et al. ................. 710/62 |
| 6,236,231 B1 | 5/2001 | Nguyen et al. |
| 6,404,228 B1 * | 6/2002 | Luna et al. .................... 326/66 |
| 6,566,911 B1 | 5/2003 | Moyer |
| 6,717,435 B1 * | 4/2004 | Mitsumori et al. ........... 326/38 |
| 2005/0068309 A1 | 3/2005 | Chang et al. |
| 2005/0088201 A1 * | 4/2005 | Devlin et al. ................. 326/38 |

FOREIGN PATENT DOCUMENTS

TW    094102061    1/2005

\* cited by examiner

*Primary Examiner*—James Cho
*Assistant Examiner*—Thienvu V Tran
(74) *Attorney, Agent, or Firm*—Winston Hsu

(57) ABSTRACT

A chip with an adjustable pinout function is disclosed. The chip includes a first pinout, a second pinout, a logic circuit, and a selecting circuit. The logic circuit includes a first port and a second port. The selecting circuit, which is coupled to the logic circuit, the first pinout, and the second pinout, controls the first pinout to be coupled to the first port or the second port, and controls the second pinout to be coupled to the first port or the second port.

20 Claims, 8 Drawing Sheets

CHIP WITH ADJUSTABLE PINOUT FUNCTION AND METHOD THEREOF

BACKGROUND OF THE INVENTION

1. Field of the Invention

The present invention relates to a chip, and more especially, to a chip with an adjustable pinout function and a method thereof.

2. Description of the Prior Art

A printed circuit board (PCB) generally has several chips and several passive devices thereon. Because most electronic products using PCBs tend to be shrunk in volume, the layout and wiring of devices on the PCBs become more and more important for shrinking purposes. Practically, the wiring on the PCB is designed as short as possible such that the area of the PCB is minimized and the interference among the wirings or from outside the PCB is reduced. As a result, the layout and wiring of devices on the PCB must be implemented in correspondence to the pinout definitions of the chip adopted on the PCB. Therefore, the devices are set on proper positions of the PCB. Please refer to FIG. 1. The PCB 100 has chips 110, 120, and 130 positioned thereon. It is assumed that the pins on the side A of the chip 110 have connection relationships with the pins on the side A' of the chip 120, and that the pins on the side B of the chip 110 have connection relationships with the pins on the side B' of the chip 130. Therefore, the connection relationships between pins of chips 110, 120, and 130 constrain the placement of chips 110, 120, and 130 on the PCB for the sake of minimizing the area of the PCB and shortening the wirings. For this purpose, an exemplary layout of the chips 110, 120, and 130 is shown in FIG. 1. If the chip 120 is moved above the chip 110 on the PCB 200, as shown in FIG. 2, the length of the wirings is increased, leading to high cost, large PCB area, and undesirable interference.

In short, during manufacturing of a prior art PCB, the pinout definitions of chips constrain the layout of PCB and greatly affect the length of wirings. If the pinout definitions of chips were less limiting, the layout of the PCB would become more flexible.

SUMMARY OF THE INVENTION

It is therefore an objective of the claimed invention to provide a chip with an adjustable pinout function and the corresponding method to solve the above problem.

According to an embodiment of the claimed invention, a chip with an adjustable pinout function is disclosed. The chip comprises a first pinout, a second pinout, a logic circuit, and a selecting circuit. The logic circuit comprises a first port and a second port. The selecting circuit, which is coupled to the logic circuit, the first pinout, and the second pinout, controls the first pinout to be coupled to the first port or the second port, and controls the second pinout to be coupled to the first port or the second port.

According to another embodiment of the claimed invention, a method for adjusting the pinout function of a chip is disclosed. The chip comprises a first pinout, a second pinout, and a logic circuit having a first port and a second port. The method comprises: controlling the first pinout to be coupled to the first port or the second port; and controlling the second pinout to be coupled to the first port or the second port.

According to another embodiment of the claimed invention, a chip with an adjustable pinout function is disclosed. The chip comprises a first pinout, a second pinout, a first logic circuit, a second logic circuit, and a selecting circuit. The first logic circuit comprises a first port, and the second logic circuit comprises a second port. The selecting circuit, which is coupled to the first logic circuit, the second logic circuit, the first pinout, and the second pinout, controls the first pinout to be coupled to the first port or the second port, and controls the second pinout to be coupled to the first port or the second port.

These and other objectives of the present invention will no doubt become obvious to those of ordinary skill in the art after reading the following detailed description of the preferred embodiment that is illustrated in the various figures and drawings.

DETAILED DESCRIPTION

To increase the flexibility of device layout on a PCB, the present invention provides a chip whose pinout functions are adjustable. Depending on different applications, the user can determine a specific pinout to receive or output a certain signal such that the length of wirings can be shortened.

Figure 1:
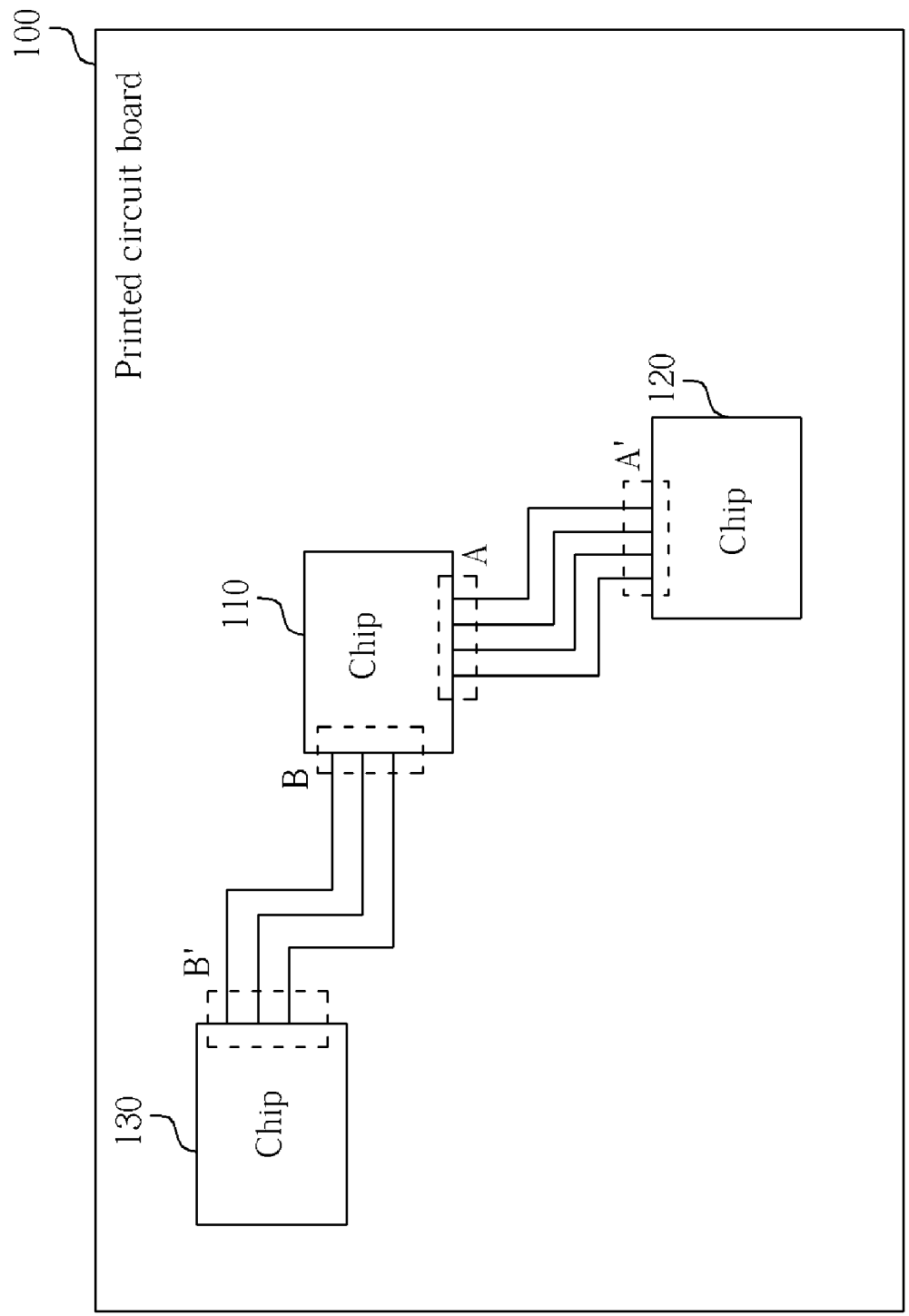
FIG. 1 is a first layout of a prior art printed circuit board.
Figure 2:
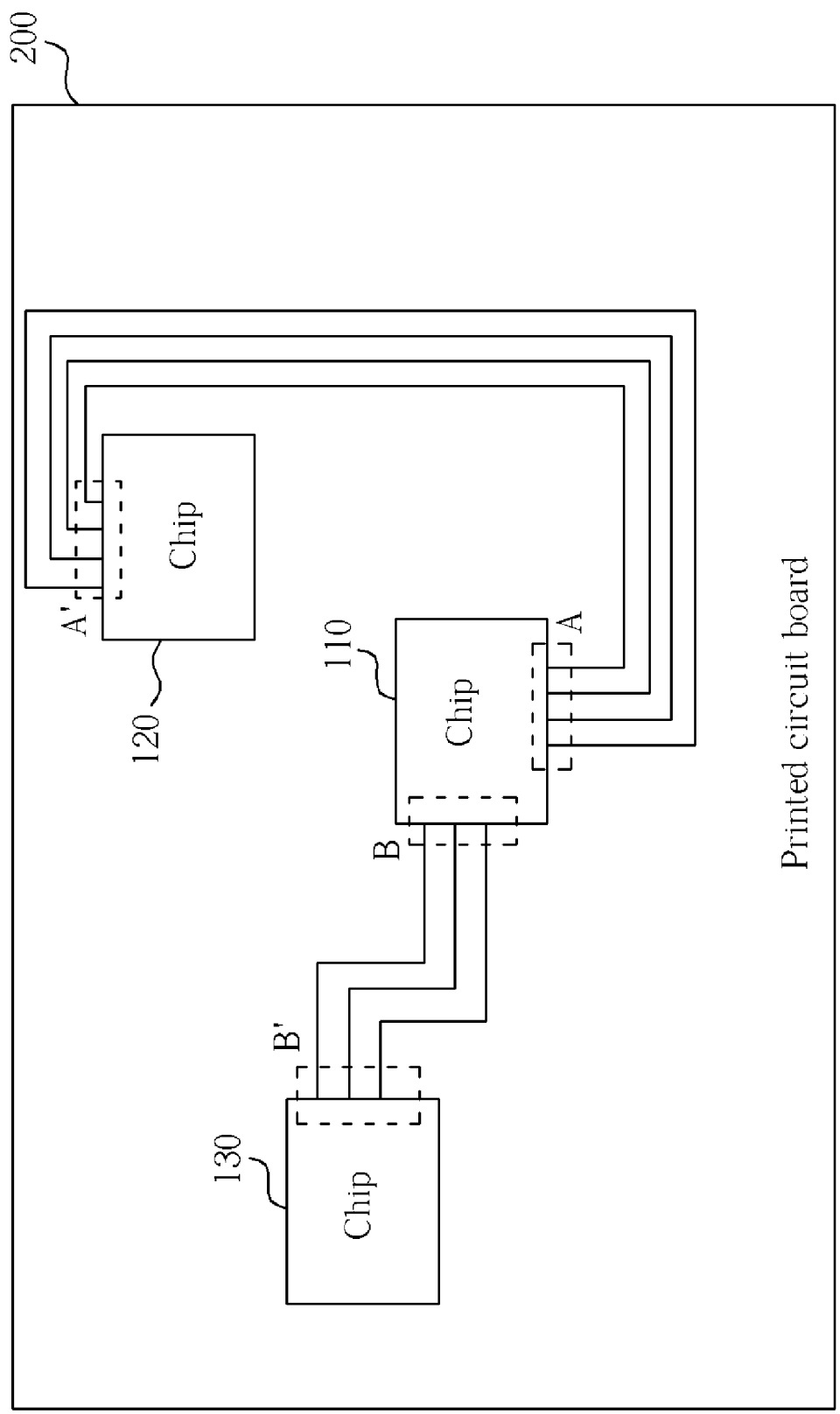
FIG. 2 is a second layout of a prior art printed circuit board.
Figure 3:
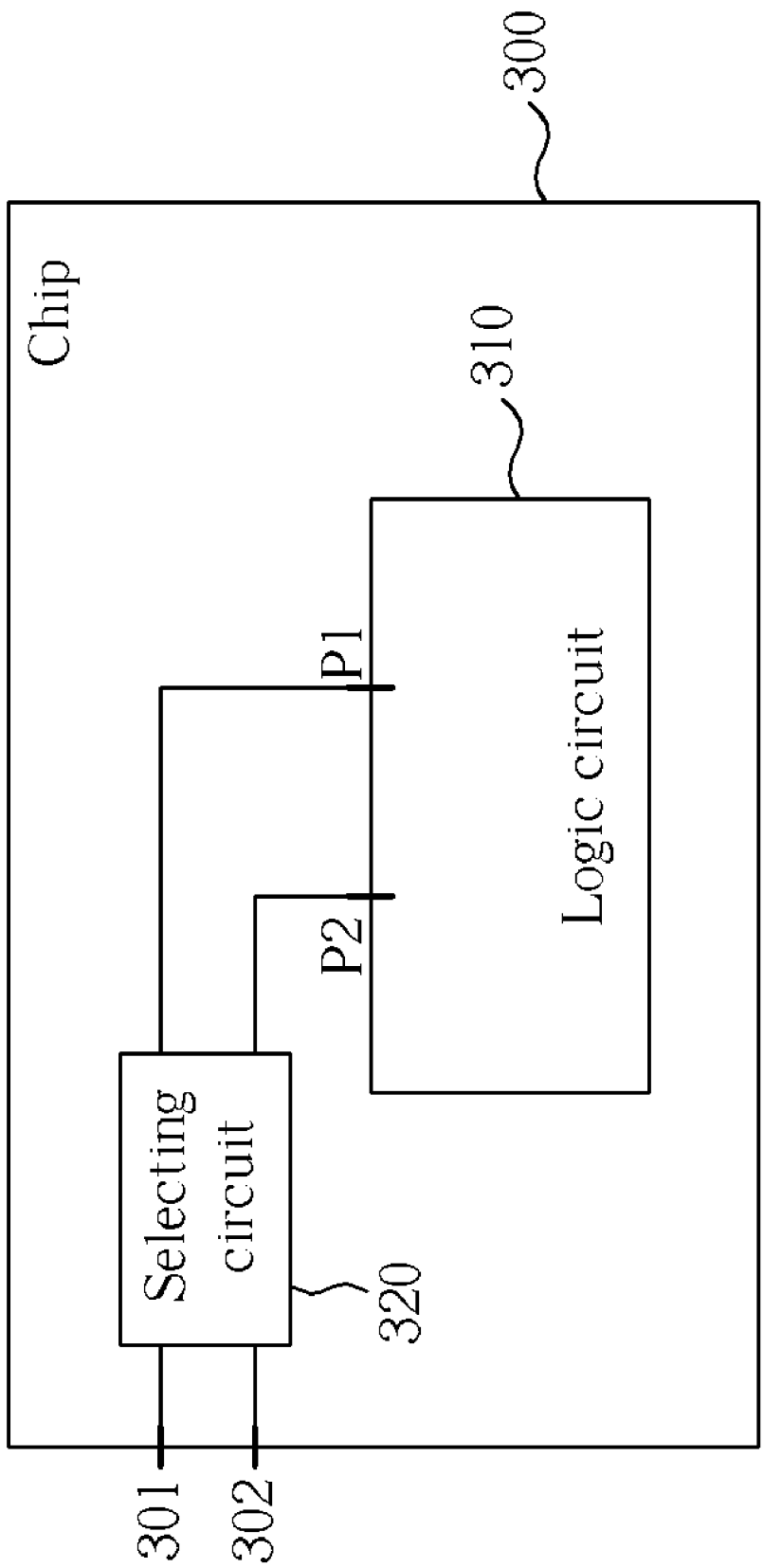
FIG. 3 illustrates the inner circuit of a chip with an adjustable pinout function according to a first embodiment of the present invention.

Please refer to FIG. 3. The chip 300 contains a plurality of pinouts 301, 302, a logic circuit 310, and a selecting circuit 320. The function of the logic circuit 310 is to generate a signal outputted by the chip 300 or to process a signal received by the chip 300. Generally, the logic circuit 310 may have several ports, but in this embodiment, only two ports P1, P2 are shown to serve as an exemplary embodiment to illustrate the mechanism utilized by the chip 300 to change pinout functions. However, this embodiment is not meant to limit the scope of this invention. As shown in FIG. 3, taking two arbitrary pinouts 301 and 302 for example, they are utilized to transmit Transistor-Transistor Logic (TTL) signal, Low Voltage Difference Signal (LVDS), or Reduced Swing Difference Signal (RSDS). The pinouts 301 and 302 are both coupled to the selecting circuit 320. The selecting circuit 320 is a switch or a multiplexer (MUX), which is coupled to the two ports P1, P2 of the logic circuit 310. By controlling the selecting circuit 320, the user can determine the pinout 301 to be connected to the port P1 or P2 of the logic circuit 310 and determine the pinout 302 to be connected to the port P1 or P2 of the logic circuit 310. Generally, if the selecting circuit 320 determines the pinout 301 to be connected to the port P1, then the selecting circuit 320 determines the pinout 302 to be connected to the port P2, and vice versa. For example, the function of the port P1 is defined to receive a data signal inputted through the pinout 301, and the function of the port P2 is defined to transmit the data signal outputted through the pinout 302 after the data signal is processed by the logic circuit 310. However, due to the aid of the selecting circuit 320, the port P1 can receive the data signal through the pinout 302, and the port P2 can output the data signal through the pinout 301 after the data signal is processed by the logic circuit 310. However, in some circumstances, the pinouts 301 and 302 can be connected to the same port P1 or P2. Practically, by setting the selecting circuit 320 in the chip 300, the pinout 301 can be alternatively connected to a port of the logic circuit 310; similarly, the pinout 302 can be alternatively connected to a port of the logic circuit 310. Therefore, in designing the layout of a PCB, more flexibility is provided to determine the output signal on a certain pinout. That is, the function of a pinout becomes adjustable.

Figure 4:
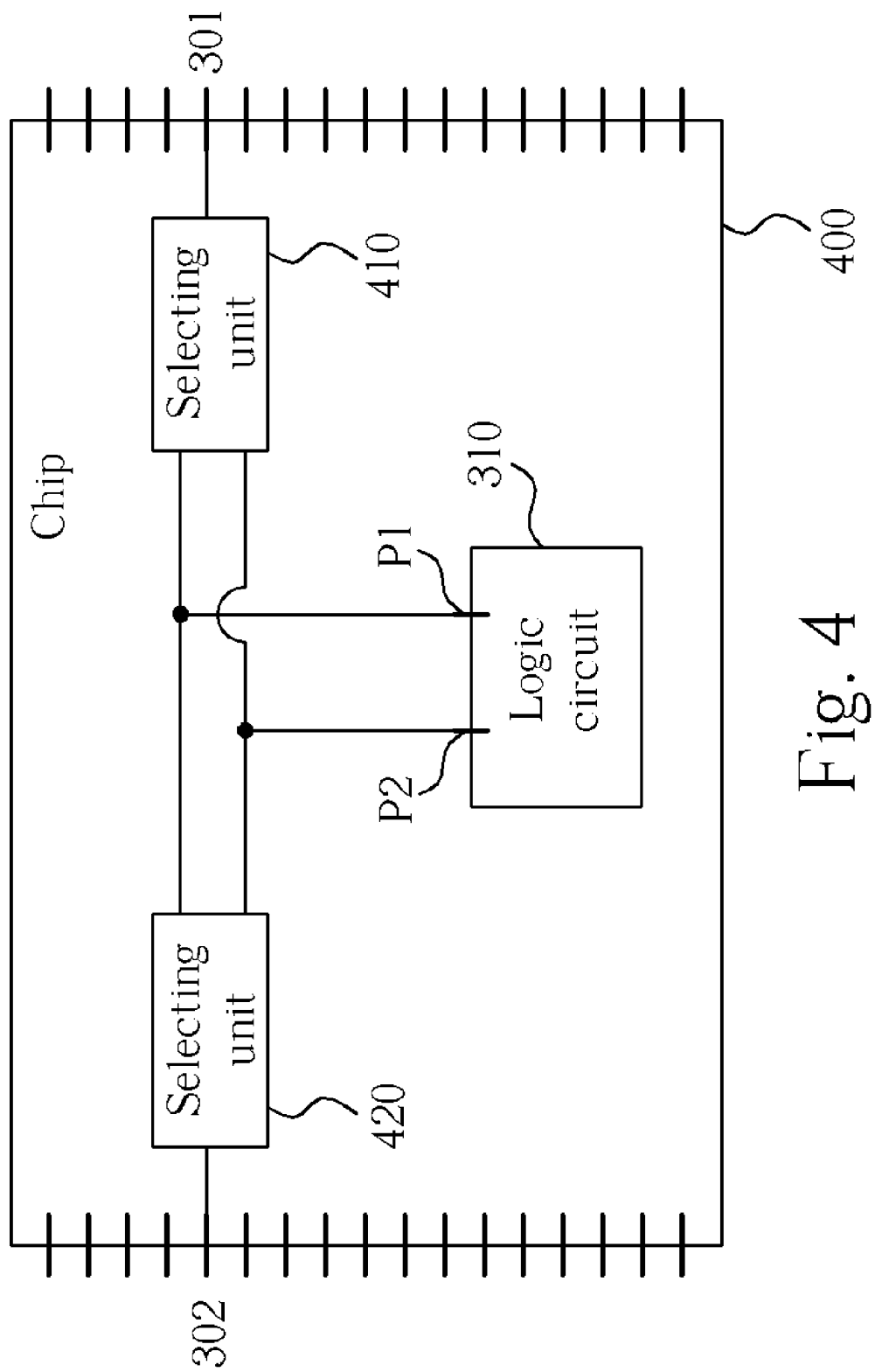
FIG. 4 illustrates the inner circuit of a chip with an adjustable pinout function according to a second embodiment of the present invention.

According to the embodiment shown in FIG. 3, the selecting circuit 320 consists of one or more selecting units. Please refer to FIG. 4. The chip 400 contains two selecting units 410 and 420. The selecting unit 410 determines the pinout 301 to be connected to the port P1 or P2; the other selecting unit 420 determines the pinout 302 to be connected to the port P1 or P2.

Figure 5:
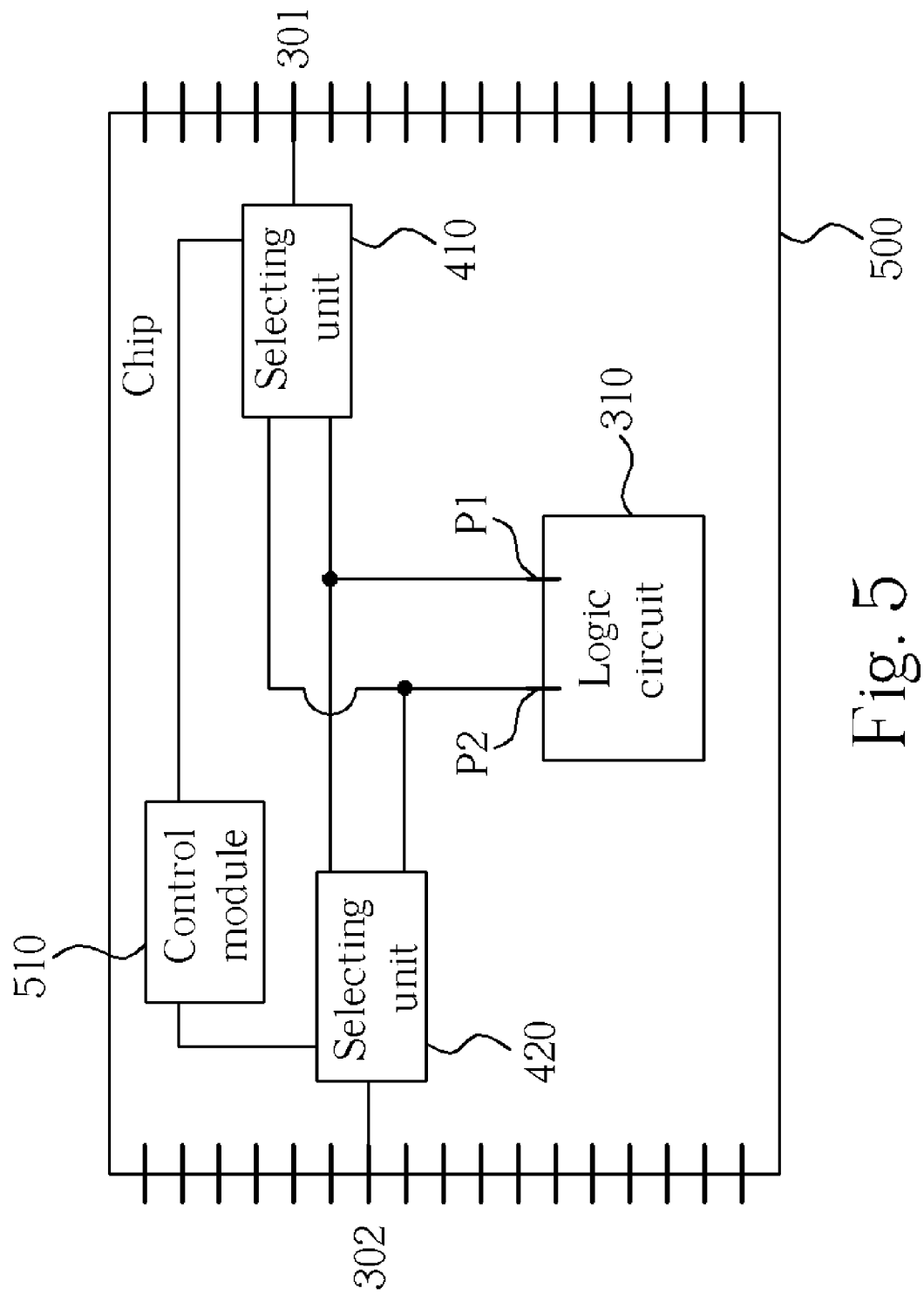
FIG. 5 illustrates the inner circuit of a chip with an adjustable pinout function according to a third embodiment of the present invention.

The selecting units 410 and 420 described in the aforementioned embodiment can receive control signals from outside the chip 400 to determine the connection between the pinouts 301, 302 and the ports P1, P2. However, it is optional to set a control module 510 in the chip 400 that generates control signals required by the selecting units 410 and 420. As shown in FIG. 5, the selecting units 410 and 420 are further connected to the control module 510, which is a register or more specifically, a non-volatile memory. The user can change the control value(s) stored in the register, i.e., the control module 510, according to practical requirements. The control value is the control signal utilized to control selecting units 410 and 420. In this embodiment, the control signal utilized to control the selecting unit 410 and the control signal utilized to control the selecting unit 420 may correspond to the same control value or to different control values. The selecting units 410 and 420 determine the pinouts 301 and 302 to be connected to the ports P1 or P2 according to the same control value or to different control values. The selecting units 410 and 420 are controlled by the same control signal or different control signals generated by the control module 510.

Figure 6:
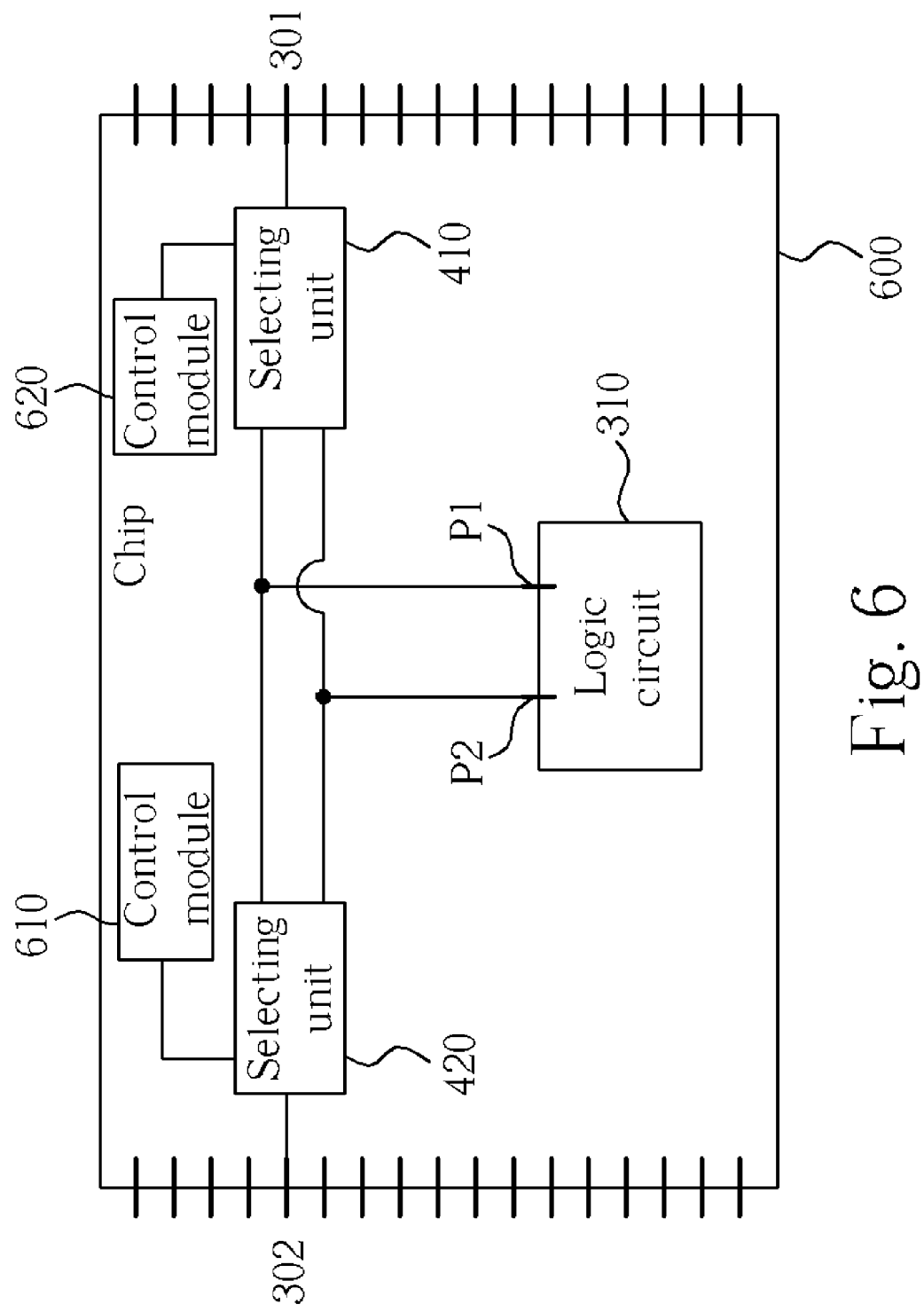
FIG. 6 illustrates the inner circuit of a chip with an adjustable pinout function according to a fourth embodiment of the present invention.

The selecting units 410 and 420 may be connected to different control modules. Referring to FIG. 6, the selecting unit is connected to the control module 620 and the selecting unit 420 is connected to another control module 610. These two selecting units 410 and 420 are controlled by different control signals from different control modules 610, 620. The control modules 610 and 620 are registers or more specifically, non-volatile memories, which store control values as control signals, respectively. The control values are either fixed or adjustable. Compared with the chip 500 shown in FIG. 5, the control modules 610 and 620 are set closer to the selecting units 410 and 420 such that the length of the wiring (for transmitting control signals) is reduced and the layout is less complicated.

Figure 7:
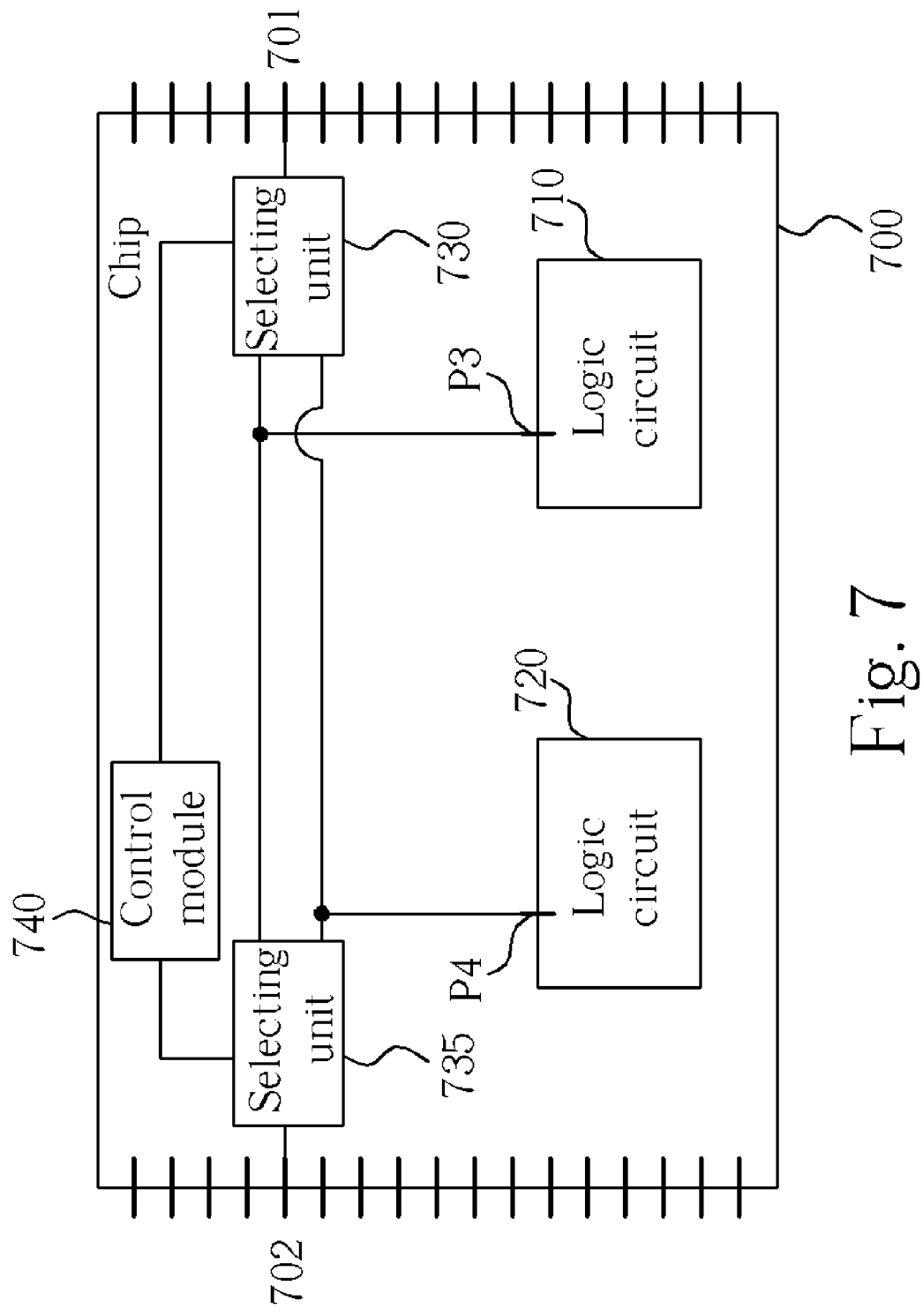
FIG. 7 illustrates the inner circuit of a chip with an adjustable pinout function according to a fifth embodiment of the present invention.

Please note, in the above-mentioned embodiment, only two ports, two pinouts, and either a selecting circuit or two selecting units, are shown to serve as an exemplary embodiment but are not meant to be limiting. For example, the chip 400 may have more than two pinouts simultaneously and correspondingly connect to more than two ports of the logic circuit 310. Accordingly, since more than two pinouts are adjustable, there are more than two selecting units utilized to control these pinouts respectively. Moreover, there are more possible embodiments. Please refer to FIG. 7. The chip 700 consists of a plurality of logic circuits 710, 720, a plurality of pinouts 701, 702 that respectively connect to a plurality of selecting units 730, 735, and a control module 740 coupled to the selecting units 730 and 735. Both these two selecting units 730 and 735 are coupled to the port P3 of the logic circuit 710 and the port P4 of the logic circuit 720. As a result, the pinouts 701 and 702 can be selectively connected to the ports P3 or P4 of different logic circuits 710 and 720. In this embodiment, the logic circuits 710 and 720 are independent circuits. The signal received or transmitted by the logic circuit 710 through the port P3 is independent of the logic circuit 720, and the signal received or transmitted by the logic circuit 720 through the port P4 is independent of the logic circuit 710. Generally, if the selecting unit 730 determines the pinout 701 to be connected to the port P3, then the selecting unit 735 determines the pinout 702 to be connected to the port P4, and vice versa. However, in some specific circumstances, the pinouts 701 and 702 are connected to the same port P3 or P4. The selecting units 730 and 735 are controlled by control signals generated by the control module 740. As mentioned above, the control module 740 is a register or more specifically, a non-volatile memory that stores control values as control signals. The control values are either fixed or adjustable. Similarly, the control signals for controlling the selecting units 730 and 735 may correspond to the same control value or different control values. In addition, the pinouts 701 and 702 are utilized to transmit Transistor-Transistor Logic (TTL) signal, Low Voltage Difference Signal (LVDS), or Reduced Swing Difference Signal (RSDS). The selecting units 730 and 735 can be implemented by switches or MUXs.

Figure 8:
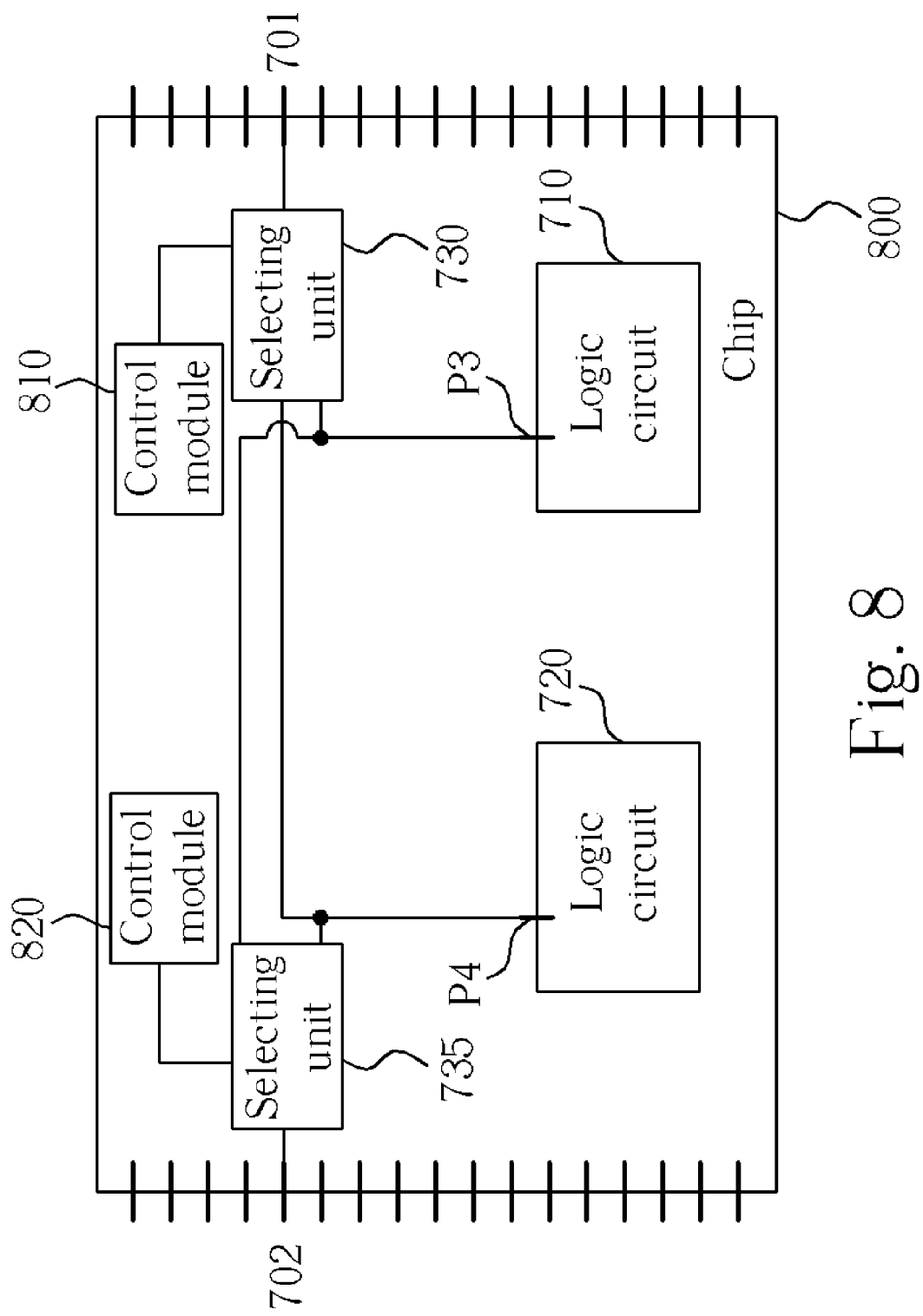
FIG. 8 illustrates the inner circuit of a chip with an adjustable pinout function according to a sixth embodiment of the present invention.

The selecting units 730 and 735 may be connected respectively to different control modules, as shown in FIG. 8, the selecting unit 730 is connected to the control module 810, and the selecting unit 735 is connected to another control module 820. These two selecting units 730 and 735 are controlled by different control signals generated by different control modules. The control modules 810 and 820 are registers or more specifically, non-volatile memories, which store control values as control signals.

In summary, the present invention provides a chip whose pinout functions are adjustable. The user determines the pinouts to be selectively connected to different ports by controlling switches or MUXs, i.e., selecting units. The specification of input/output signal on a pinout is not fixed; however, it is programmable according to design conditions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip with adjustable pinout function, comprising:
a plurality of chip-sides;
a plurality of pinouts distributed on the plurality of chip-sides, comprising:
a first pinout located at a first chip-side among the plurality of chip-sides; and
a second pinout located at a second chip-side among the plurality of chip-sides;

a logic circuit comprising a first port and a second port, the first and second ports being for outputting signals generated by the logic circuit, and each of the first and second ports being coupled to or decoupled from the first pinout and/or the second pinout; and a selecting circuit, coupled between the first and second ports and the first and second pinouts, for controlling the first pinout to be coupled to the first port and the second pinout to be coupled to the second port in response to a first pinout function, and controlling the first pinout to be coupled to the second port and the second pinout to be coupled to the first port in response to a second pinout function;

wherein the selecting circuit further controls both of the first and second pinouts to be coupled to the first port in response to a third pinout function, and controls both of the first and second pinouts to be coupled to the second port in response to a fourth pinout function.

2. The chip of claim 1, wherein the selecting circuit comprises a first selecting unit and a second selecting unit, the first selecting unit controlling the first pinout to be coupled to the first port or the second port and the second selecting unit controlling the second pinout to be coupled to the first port or the second port.

3. The chip of claim 1, further comprising:
a control module, coupled to the selecting circuit, for generating a first control signal utilized to control the selecting circuit to couple the first pinout to the first port or the second port, and a second control signal utilized to control the selecting circuit to couple the second pinout to the first port or the second port.

4. The chip of claim 3, wherein the control module comprises at least a register for storing at least a control value as the first and the second control signals.

5. The chip of claim 4, wherein the register is a non-volatile memory.

6. The chip of claim 4, wherein the control value is adjustable.

7. The chip of claim 3, wherein the control module comprises:
a first control module, coupled to the selecting circuit, for generating a first control signal utilized to control the selecting circuit to couple the first pinout to the first port or the second port; and
a second control module, coupled to the selecting circuit, for generating a second control signal utilized to control the selecting circuit to couple the second pinout to the first port or the second port.

8. The chip of claim 1, wherein the selecting circuit comprises at least a switch or at least a multiplexer.

9. The chip of claim 1, wherein if the first pinout is coupled to the first port, the second pinout is coupled to the second port; and if the first pinout is coupled to the second port, the second pinout is coupled to the first port.

10. The chip of claim 1, wherein the first and the second pinouts are utilized for transmitting Transistor-Transistor Logic (TTL) signal, Low Voltage Difference Signal (LVDS), or Reduced Swing Difference Signal (RSDS).

11. A chip with adjustable pinout function, comprising:
a plurality of chip-sides;
a plurality of pinouts distributed on the plurality of chip-sides, comprising:
a first pinout located at a first chip-side among the plurality of chip-sides; and
a second pinout located at a second chip-side among the plurality of chip-sides;
a first logic circuit comprising a first port, the first port being for outputting a signal generated by the first logic circuit and coupled to or decoupled from the first pinout and/or the second pinout;
a second logic circuit comprising a second port, the second port being for outputting a signal generated by the second logic circuit, and coupled to or decoupled from the first pinout and/or the second pinout; and
a selecting circuit, coupled between the first and second ports and the first and second pinouts, for controlling the first pinout to be coupled to the first port and the second pinout to be coupled to the second port in response to a first pinout function, and controlling the first pinout to be coupled to the second port and the second pinout to be coupled to the first port in response to a second pinout function;

wherein the selecting circuit further controls both of the first and second pinouts to be coupled to the first port in response to a third pinout function, and controls both of the first and second pinouts to be coupled to the second port in response to a fourth pinout function.

12. The chip of claim 11, further comprising:
a control module, coupled to the selecting circuit, for generating a first control signal utilized to control the selecting circuit to couple the first pinout to the first port or the second port, and a second control signal utilized to control the selecting circuit to couple the second pinout to the second port or the first port.

13. The chip of claim 12, wherein the control module comprises a non-volatile memory for storing at least a control value as the first and the second control signals.

14. The chip of claim 13, wherein the control value is adjustable.

15. The chip of claim 11, wherein the selecting circuit comprises at least a switch or at least a multiplexer.

16. The chip of claim 11, wherein if the first pinout is coupled to the first port, the second pinout is coupled to the second port; and if the first pinout is coupled to the second port, the second pinout is coupled to the first port.

17. The chip of claim 11, wherein the first and the second pinouts are utilized for transmitting Transistor-Transistor Logic (TTL) signal, Low Voltage Difference Signal (LVDS), or Reduced Swing Difference Signal (RSDS).

18. The chip of claim 11, wherein the selecting circuit comprises a first selecting unit and a second selecting unit, the first selecting unit is utilized for controlling the first pinout to be coupled to the first port or the second port, and the second selecting unit is utilized for controlling the second pinout to be coupled to the first port or the second port.

19. The chip of claim 1, wherein the selecting circuit controls the first pinout to be coupled from the first port to the second port, and the second pinout to be coupled from the second port to the first port when the second pinout function takes the place of the first pinout function.

20. The chip of claim 11, wherein the selecting circuit controls the first pinout to be coupled from the first port to the second port, and the second pinout to be coupled from the second port to the first port when the second pinout function takes the place of the first pinout function.

* * * * *